United States Patent [19]

Jung

[11] Patent Number: 6,034,884
[45] Date of Patent: Mar. 7, 2000

[54] NONVOLATILE DYNAMIC RANDOM ACCESS MEMORY WITH FERROELECTRIC CAPACITORS

[75] Inventor: Dong-Jin Jung, Kyunggi-do, Rep. of Korea

[73] Assignee: Samsung Electronics Co., Ltd., Suwon, Rep. of Korea

[21] Appl. No.: 09/369,933

[22] Filed: Aug. 9, 1999

[30] Foreign Application Priority Data

Aug. 7, 1998 [KR]  Rep. of Korea ................. 98-32233

[51] Int. Cl.[7] ............................................ G11C 7/00
[52] U.S. Cl. ............................................ 365/145; 365/203
[58] Field of Search .................... 365/145, 149, 365/190, 203

[56] References Cited

U.S. PATENT DOCUMENTS

5,515,312  5/1996  Nakakuma et al. ................ 365/145
5,675,530  10/1997  Hirano et al. ................... 365/145

*Primary Examiner*—Vu A. Le
*Attorney, Agent, or Firm*—Jones Volentine, L.L.P.

[57] ABSTRACT

A nonvolatile DRAM is disclosed, which comprises a plurality of word lines, at least one plate line, at least a pair of bit lines arranged to intersect the word lines, and a plurality of memory cells each having two access transistors and two ferroelectric capacitors, which are connected between the bit lines. One electrode of each of the capacitors is connected through a corresponding access transistor to a corresponding one of the bit lines. The access transistors are commonly connected with corresponding ones of the word lines. The other electrodes of the capacitors are commonly connected with the plate line. Also provided is a voltage supply circuit for supplying the plate line with one of first and second voltages. In addition, a precharge circuit is included to sequentially precharge the pair of bit lines with the first, the second, and a third voltage in response to first, second, and third precharge signals before a data write/read operation, and then with the third, second, and third voltages after the data write/read operation.

7 Claims, 8 Drawing Sheets

NONVOLATILE DYNAMIC RANDOM ACCESS MEMORY WITH FERROELECTRIC CAPACITORS

This application relies for priority upon Korean Patent Application No. 98-32233, filed on Aug. 7, 1998, the contents of which are herein incorporated by reference in their entirety.

FIELD OF THE INVENTION

The present invention relates to a semiconductor memory device, and more particularly to a nonvolatile dynamic random access memory (DRAM) employing a half-Vcc plate skim.

BACKGROUND OF THE INVENTION

Ferroelectric memories have the potential to be developed into nonvolatile memories due to their inherent high performance, such as short write time and high write durability. The memory cell structures in a DRAM can include ferroelectric capacitors and MOS transistors, enabling the stable operation of the memory. Such memory cell structure is disclosed, for example, in IEEE J. Solid-State Circuits, vol. 23, pp. 1171–1175, December, 1989, entitled "An Experimental 512-bit Nonvolatile Memory with Ferroelectric Storage Cell."

The write time of a ferroelectric memory is at least one order of magnitude shorter than that of a flash memory, but is a little longer than that of a non-ferroelectric DRAM. This is due to the fact that the ferroelectric memory has a plate line driven by pulses, though it shows read/write operations similar to those of DRAM. The write durability of a ferroelectric memory is a few orders of magnitude longer than that of a flash memory, but a few orders of magnitude shorter than that of non-ferroelectric DRAM. The write durability is limited by the fatigue of the ferroelectric capacitor caused by polarization switching for its write operations.

A ferroelectric memory has the disadvantage of low density, which results in the following problems for such a DRAM cell structure. The plate must be separated into pulsed plate lines, and a 2T/2C (two-transistor and two-capacitor) cell must be employed instead of a 1T/1C (one-transistor and one-capacitor) cell in order to cope with the generation of a reference voltage in the complementary bit lines. Also, the signal reduction should be considered according to fatigue.

The pulsed plate lines also result in an increase in the active power consumption. In order to reduce this power consumption, a multi-divided plate-line architecture for connecting 8 memory cells with a single sub-plate line is disclosed, for example, in "A 256 kb Nonvolatile Ferroelectric Memory at 3 V and 100 ns," ISSCC Dig. Tech. pp. 268–229, 1994, authored by T Sumi, N. Moriwaki, et al. However, this structure increases the region of the cell array, having a slower speed than DRAM. Furthermore, it has a low read durability caused by polarization switching during read operation, which is different from other memory devices.

A shadow RAM architecture is a different architecture relating to ferroelectric memories. Such an architecture may overcome the previous problems connected with the pulsed-plate ferroelectric memory. The shadow RAM has two operational modes, which are a ferroelectric memory mode (or ferro-mode, for short) and a DRAM-mode. In the ferro-mode, divided plate lines are fixed at a source voltage $V_{cc}$, and the stored voltage is detected as in a DRAM. If it is necessary to securely store information as nonvolatile information, however, the shadow RAM is operated in ferro-mode, or otherwise, in the DRAM-mode. The stored voltage is either 0 V or $V_{cc}$, and the plate voltage is $V_{cc}$, so that polarization switching does not occur during write and read operations in the DRAM-mode. The resulting unipolar operation provides for a high write/read durability compared to a conventional DRAM.

The high-speed and low-power operation may be achieved in a DRAM-mode because of the fixed voltage of the plate lines. However, since the plate is divided into pulsed plate lines in the ferro-mode, the density may not be improved.

Even though the shadow RAM architecture overcomes the problems of the pulsed-plate ferroelectric memory as previously stated, other problems occur. A refreshing operation to convert the stored volatile information into the nonvolatile information stored in polarization is required prior to power-off, and the reliability of an unexpected power-off is lower than that of the pulsed-plate ferroelectric memory. The refreshing operation is required because the polarity of the ferroelectric capacitor is in the same direction in the DRAM-mode regardless of the stored voltage.

One of the other problems inherent in the shadow RAM architecture is that this architecture can be difficult to use because of the mode switching. In addition, the shadow RAM is incompatible with other types of memories including DRAMs and SRAMs, since additional pins are required to demand the mode switching.

In order to eliminate such problems connected with the pulsed-plate ferroelectric memory and shadow RAM, a non-volatile DRAM device of another architecture is disclosed in IEICE TRANS. ELECTRON, VOL. E79-C. No. 2, February, 1996, entitled "Half-Vcc Plate Nonvolatile DRAMs with Ferroelectric Capacitors," authored by K. Takeuchi, et al.

Figure 1:
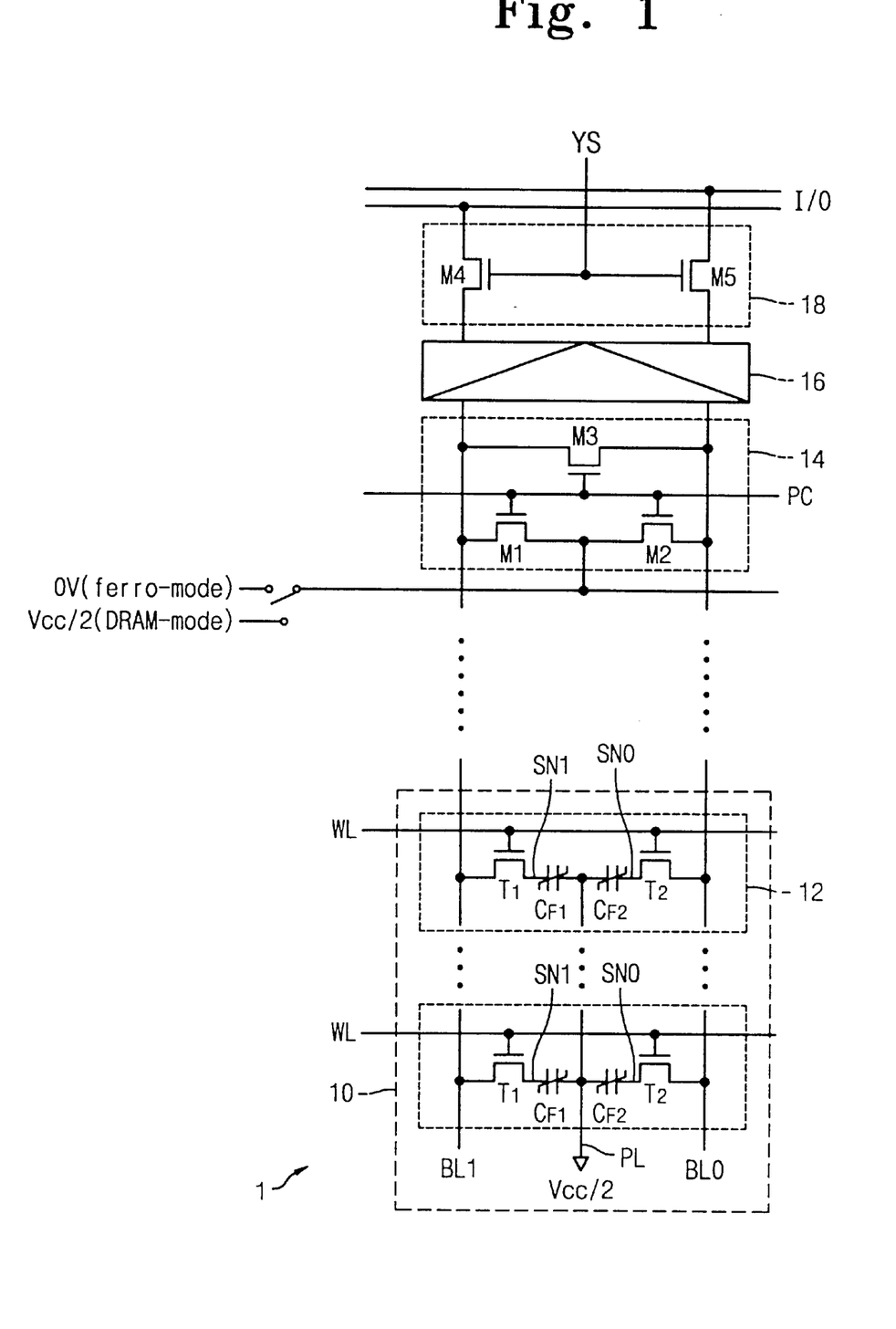
FIG. 1 is a block diagram for illustrating the core circuit of a conventional nonvolatile DRAM.

FIG. 1 shows a conventional half-$V_{cc}$ plate nonvolatile DRAM. The structure of the memory cell array 10 is essentially the same as that of a conventional DRAM except for the existence of a precharge circuit 14 for selectively supplying one of two precharge voltages, 0 V and $V_{cc}/2$ to the bit lines $BL_1$ and $BL_0$ according to the operational mode (i.e., ferro-mode or DRAM-mode). For example, the precharge voltage is 0 V in the ferro-mode where polarization is detected, or $V_{cc}/2$ in the DRAM-mode. The voltage of the common plate (the PL) is fixed at $V_{cc}/2$ in the ferro- and DRAM-mode. Even though such an operational procedure may be applied to the 1T/1C cell structure consisting of one transistor and one ferroelectric capacitor, the conventional memory cell 12 comprises two transistors $T_1$ and $T_2$ and two ferroelectric capacitors $C_{F1}$ and $C_{F2}$.

Unfortunately, the 1T/1C cell structure may not be practically applied because it is difficult to develop the circuits for generating reference voltages to the complementary bit lines. The DRAM further comprises a precharge circuit 14 composed of three connected NMOS transistors $M_1$, $M_2$, $M_3$, sense amplifier 16, and a column pass gate circuit (Y-pass gate circuit) 18 composed of switches $M_4$ and $M_5$ respectively connected to the input/output (I/O) lines.

Figure 2A:
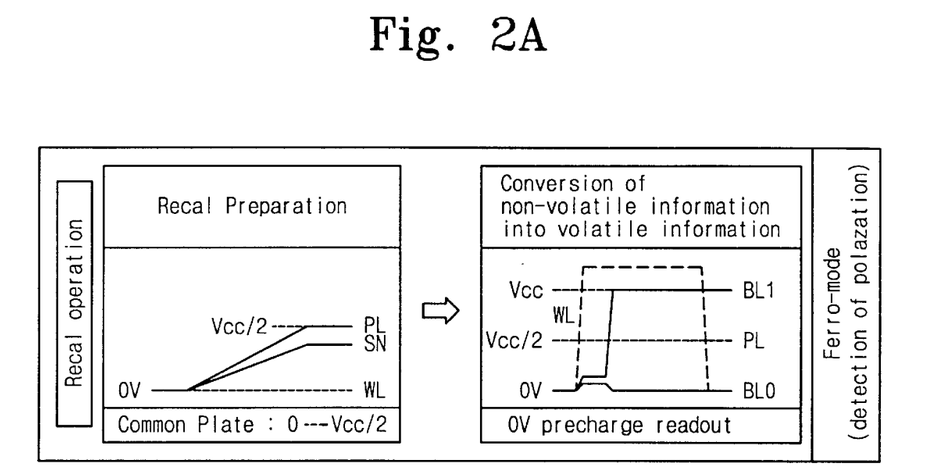
FIGS. 2A to 2C are diagrams illustrating the fundamental operation of a DRAM as shown in FIG. 1.
Figure 2B:
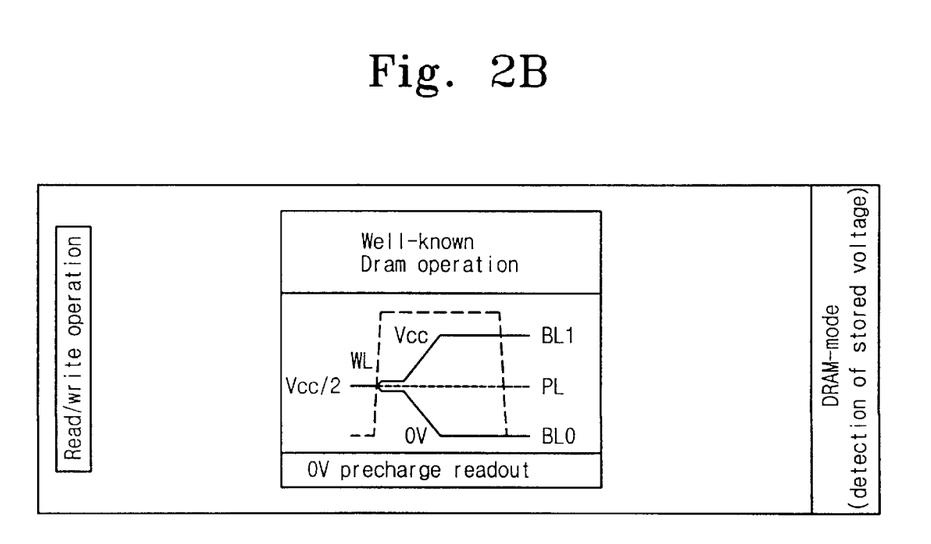
Figure 2C:
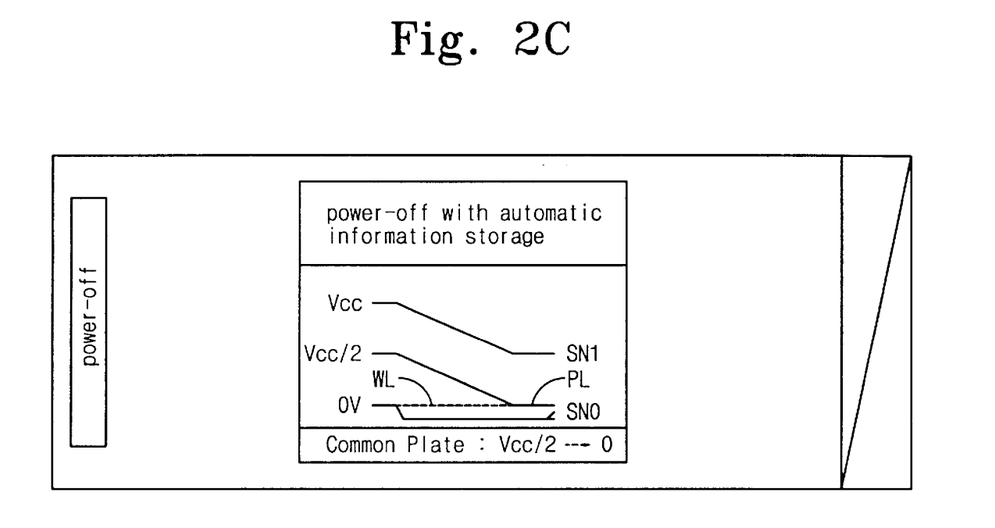

Referring to FIGS. 2A to 2C, the fundamental operation of the memory cell 12 comprises a recall operation, a read/write operation, and a power-off operation. FIG. 2A illustrates the recall operation; FIG. 2B illustrates the read/write operation; and FIG. 2C illustrates the power-off operation.

When power is on, there are detected polarization states induced in the ferroelectric capacitors $C_{F1}$ and $C_{F2}$ in the recall operation (ferro-mode). At the first recall step, the common plate PL is set to a voltage of $V_{cc}/2$ in order to prepare for the recall operation. This is carried out by increasing the voltages of the storage nodes $SN_1$ and $SN_0$ in the floating state without losing nonvolatile information. In this case, the word lines WL remain in an inactive state.

At the second recall step, the nonvolatile information (polarized state) is converted into the corresponding volatile information (stored voltage), and an operation similar to the refresh operation of DRAM is carried out until the bit lines $BL_1$ and $BL_0$ are precharged with 0 V. The bit line voltage after the activation of the word line is principally determined by the capacitance ratio, depending upon the polarized state of the capacitor as follows.

The bit line voltage after the activation of the word line is kept near 0 V if the capacitance of the bit line is much greater than that of the ferroelectric capacitor. This is caused by the fact that the bit line voltage is 0 V before the activation of the word line while the storage voltage is about $V_{cc}/2$. Because the voltage of the common plate PL is $V_{cc}/2$, the polarized states of the capacitors take the same direction after the activation of the word line.

As for the 2T/2C cell, the polarized states of the two capacitors are set oppositely. This means that one of the two polarized states is switched after the activation of the word line. The effective capacitance of the switched capacitor is larger than that of the non-switched capacitor since additional charge flows into the switched capacitor. Consequently, the voltage of the bit line BL after the activation of the word line, as shown in FIGS. 2A and 2B, is larger for the bit line $BL_1$ connected with the switched capacitor than for the bit line $BL_0$ connected with the non-switched capacitor.

The voltage difference between the bit line pair is detected and amplified by the sense amplifier 16. Then, the word line is non-activated, completing the recall operation respecting the word line. Thus, the recall operation is repeated for all of the word lines connected with the memory cells 12 containing non-volatile information recalled.

After completing the recall operation, the memory cells 12 function in the same way as a DRAM. In read/write operation, the stored voltages are detected by precharging the bit lines BL1 and BL0 with $V_{cc}/2$ in (DRAM-mode). The voltage of the PL is fixed at $V_{cc}/2$. It should be noted that the polarization is not switched during read operation regardless of the polarized states, which is different from operation in a pulsed-plate ferroelectric memory. The refresh operation is performed in a DRAM-mode as it would be in a conventional DRAM. The polarization switching does not occur in the refresh operation as in the read operation.

When power is on, a restoring operation from volatile information to non-volatile operation is not required, which is different from the operation of a shadow RAM. This is caused by the fact that the non-volatile information (polarized states) is generated simultaneously with the volatile information (stored information), even though the information stored in the conventional memory is changed in DRAM mode during the read operation. The word lines are not activated in order to prevent any loss of information during a power-off operation. In order to securely store information, the voltage of the PL is reduced from $V_{cc}/2$ to 0 V during power-off. This prevents the voltage of the storage node SN1 from being lowered faster than the voltage of the PL due to current leakage after stopping the refresh operation.

As described above, the problem with a conventional nonvolatile DRAM is that the detection of polarization, namely, the recall operation, is performed for all the memory cells in the ferro-mode prior to a read/write operation. In addition, since the voltage stored in the storage node may be dissipated at the time in the recall operation, the refresh operation should be performed as in DRAM.

SUMMARY OF THE INVENTION

It is an object of the present invention to provide a nonvolatile DRAM employing half-Vcc common plate skim without the recall or refresh operation.

According to the present invention, a nonvolatile dynamic random access memory comprises a plurality of word lines, a plate line, a bit line pair, including first and second bit lines, arranged to intersect the word lines, a plurality of memory cells connected to a corresponding word line between the pair of bit lines, each memory cell comprising first and second access transistors and first and second ferroelectric capacitors, the first ferroelectric capacitor and the first access transistor being connected in series between the first bit line and the plate line, the second ferroelectric capacitor and the second access transistor being connected in series between the second bit line and the plate line, and gates of the first and second access transistors being commonly connected with the corresponding word line, a precharge circuit for sequentially precharging the bit line pair with one of a first, second, and third voltage in response to first, second, and third precharge signals, and a voltage supply circuit for supplying the plate line with one of the first and second voltages.

The first voltage is a preferably source voltage, the second voltage is preferably half of the source voltage, and the third voltage preferably the ground voltage.

The precharge circuit sequentially precharges the bit line pair with one of the first, second, and third voltage before a data write/read operation, and then sequentially precharges the bit line pair with one of the first, second, and third voltages after the data write/read operation.

The plurality of word lines are preferably activated while the pair of bit lines are precharged with the second voltage by means of the precharge circuit before and after the data write/read operation.

The precharge circuit may further comprise first and second transistors having current paths connected in series between the first and second bit lines and gates supplied with the first precharge signal, the junction of the current paths being supplied with the second voltage, third and fourth transistors having current paths connected in series between the first and second bit lines and gates supplied with the second precharge signal, the junction of the current paths being supplied with the third voltage, and fifth and sixth transistors having current paths connected in series between the first and second bit lines and gates supplied with the third precharge signal, the junction of the current paths being supplied with the first voltage.

The nonvolatile dynamic random access memory may further comprise a sense amplifier, connected to the bit line pair, for detecting and amplifying the voltage difference between the bit line pair in response to a sense control signal. The nonvolatile dynamic random access memory may also further comprise a column pass gate, connected to the sense amplifier, for transferring the amplified voltage difference to an input/output line in response to a column pass control signal.

The present invention will now described more specifically with reference to the drawings attached only by way of examples.

DETAILED DESCRIPTION OF THE PREFERRED EMBODIMENTS

Figure 3:
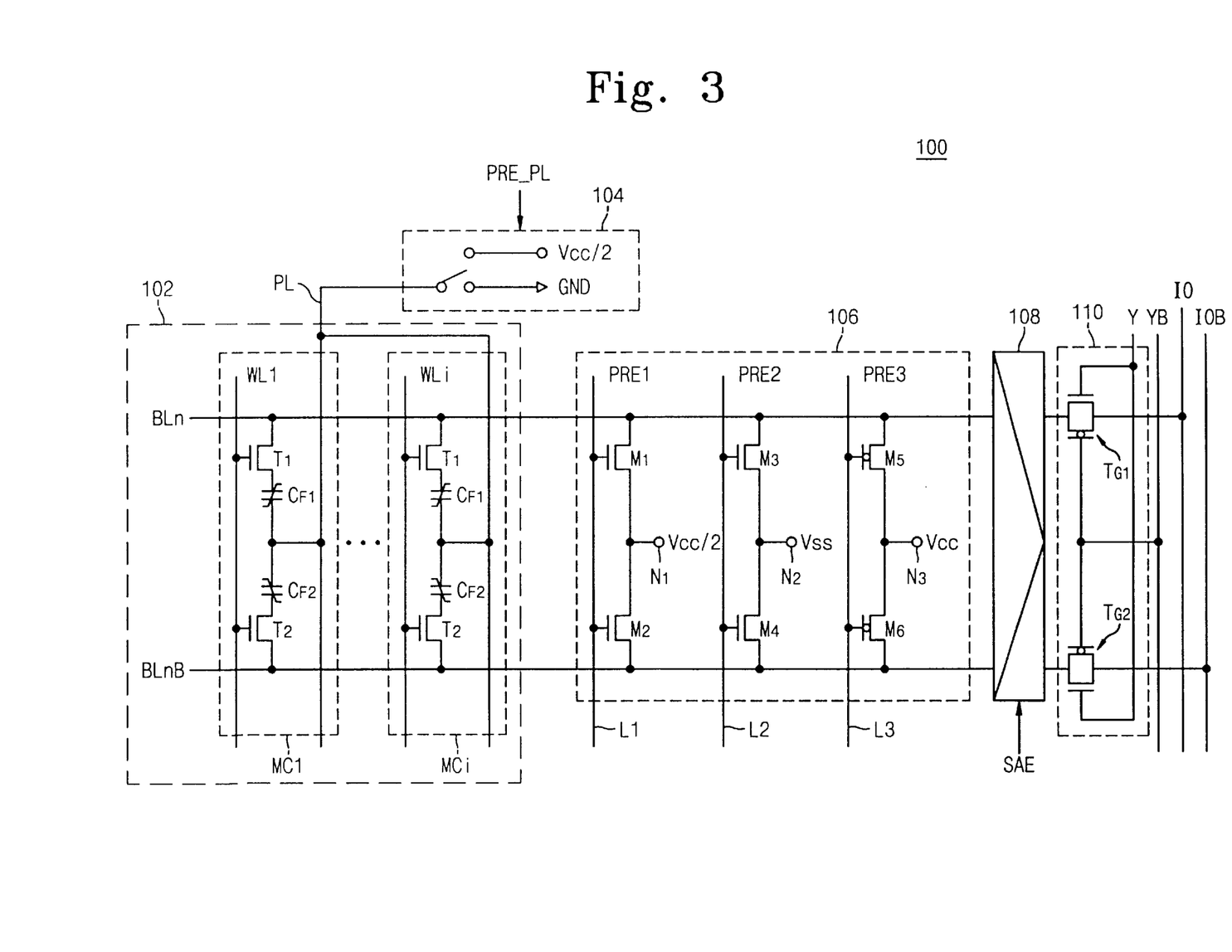
FIG. 3 is a block diagram for illustrating the core circuit of a nonvolatile DRAM in accordance with a preferred embodiment of the present invention.

Referring to FIG. 3, the core circuit of the a half-Vcc common plate nonvolatile DRAM according to a preferred embodiment of the present invention is shown. This core circuit 100 includes a memory cell array 102 for storing non-volatile information, which is provided with a plurality of word lines $WL_1$–$WL_i$ and a common plate line PL. A plurality of memory cells $MC_1$–$MC_i$ are connected between first and second bit lines BLn and BLnB arranged in the column direction of the memory cell array 102. Each of the memory cells $MC_i$ comprises first and second switch transistors (also called "access" or "charge transfer" transistors) $T_1$ and $T_2$, first and second ferroelectric capacitors $C_{F1}$ and $C_{F2}$. The ferroelectric capacitors $C_{F1}$ and $C_{F2}$ are initially set to oppositely polarized states. One electrode of each of the ferroelectric capacitors $C_{F1}$ and $C_{F2}$ are connected through respective switch transistors $T_1$ and $T_2$ to respective bit lines BLn and BLnB, and the other electrodes are connected to the common plate line PL. The gate electrodes of the memory cells $MC_1$—$MC_1$ are connected to corresponding word lines $WL_1$ and $WL_i$. For example, the gates of the transistors $T_1$ and $T_2$ of the memory cell $MC_1$ are commonly connected with the word line $WL_1$.

The common plate line PL provided in the memory cell array 102 is connected with a plate voltage supply circuit 104, which supplies a voltage $V_{cc}/2$ or 0 V to the common plate line PL in response to a signal PRE_PL. For example, the common plate line PL is supplied with a voltage of $V_{cc}/2$ or 0 V according to whether the signal PRE_PL is high or low. It will be apparent to those skilled in the art that the plate voltage supply circuit 104 may comprise PMOS and NMOS transistors (not shown in the drawing) that are switched on/off by the signal PRE_PL. As shown in FIG. 3, the bit line pair BLn and BLnB are connected with a bit line precharge circuit 106, which precharges the bit lines BLn and BLnB with one of 0 V, $V_{cc}/2$, and $V_{cc}$ in response to first, second, and third precharge signals PRE1, PRE2, PRE3, and comprises first through fourth NMOS transistors $M_1$–$M_4$ and first and second PMOS transistors $M_5$ and $M_6$. The first NMOS transistor $M_1$ has a current path formed between the first bit line BLn and the voltage source terminal $N_1$, and a gate connected to the signal line L1 transferring the precharge signal PRE1. Likewise, the second NMOS transistor $M_2$ has a current path formed between the voltage source terminal $N_1$ and the second bit line BLnB, and a gate connected with the signal line L1. The first and second NMOS transistors $M_1$ and $M_2$ precharge the first and second bit lines BLn and BLNB with $V_{cc}/2$ in response to the precharge signal PRE1.

The third NMOS transistor $M_3$, whose gate is connected with a signal line L2 transferring the precharge signal PRE2, has a current path formed between the voltage source terminal $N_2$ supplied with ground voltage VSS and the first bit line BLn. Likewise, the fourth NMOS transistor $M_4$ has a current path formed between the second bit line BLnB and ground voltage $V_{ss}$, and a gate connected with the signal line L2 transferring the precharge signal PRE2. The third and fourth NMOS transistors $M_3$ and $M_4$ precharge the first and second bit lines BLn and BLnB with the ground voltage.

The first and second PMOS transistors $M_5$ and $M_6$ have respective gates commonly connected with the signal line L3 transferring the precharge signal PRE3, and respective current paths connected in series between the first and second bit lines BLn and BLnB. The common connection point of the two current paths is connected with the voltage source terminal $N_3$ applied with the source voltage $V_{cc}$. They precharge the first and second bit lines BLn and BLnB with the source voltage $V_{cc}$.

A sense amplifier 108 is connected with the bit lines BLn and BLnB, as shown in FIG. 3, detecting and amplifying the voltage difference between the bit lines BLn and BLnB in response to a signal SAE. The amplified voltages of the bit lines BLn and BLnB are transferred through a column pass gate 110 controlled by the signals Y and YB to the input/output lines IO and IOB. The column pass gate circuit 110 comprises two CMOS transfer gates $TG_1$ and $TG_2$ connected with each other, as shown in FIG. 3.

Although FIG. 3 illustrates only a single plate voltage supply circuit 104 connected with the memory cells $MC_1$–$MC_i$, and corresponding bit line precharge circuit 106, sense amplifier 108 and column pass gate circuit 110 for convenience's sake, it is self-evident that a plurality of plate voltage supply circuits may be arranged with such circuits in the same way.

Figure 4A:
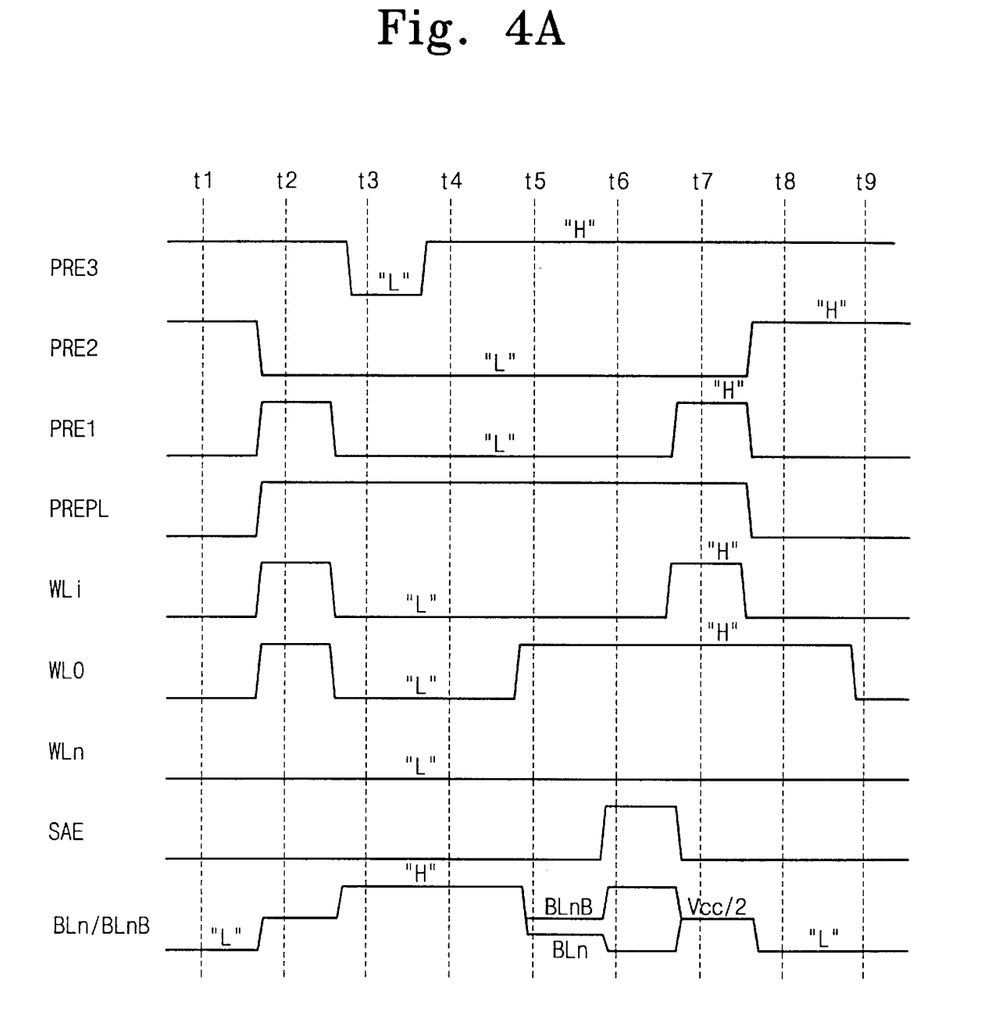
FIGS. 4A to 4C are timing diagrams illustrating the signals used in FIG. 3 according to a preferred embodiment of the inventive read operation.
Figure 4B:
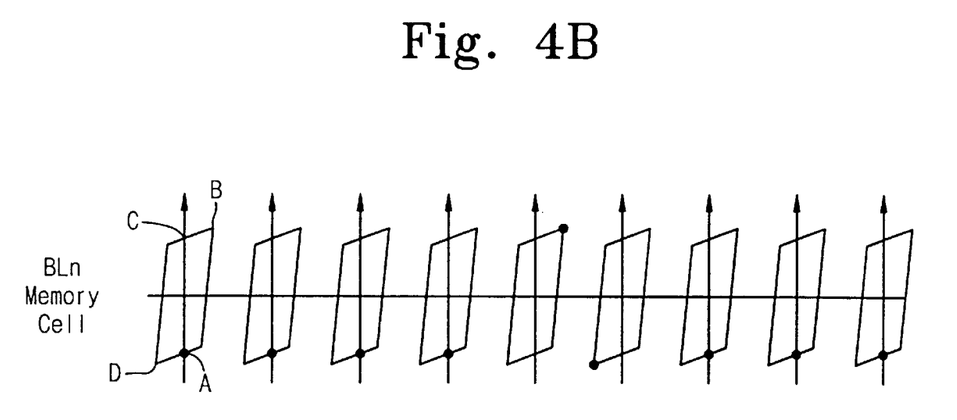
Figure 4C:
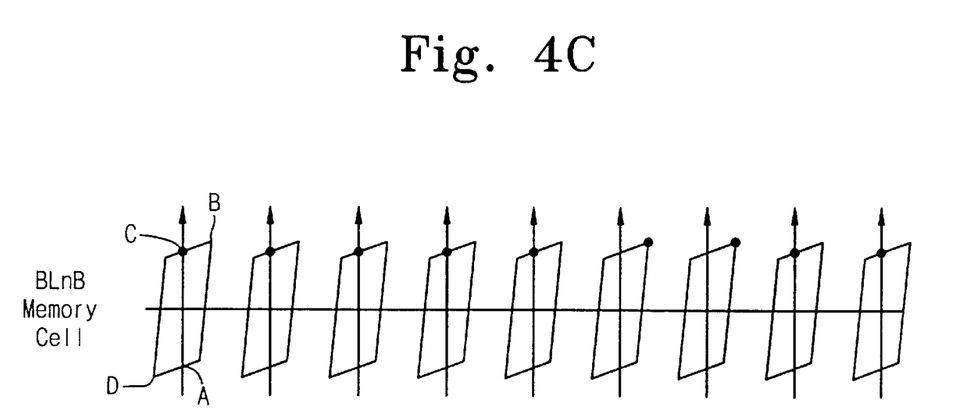

Describing the read operation of the nonvolatile DRAM in connection with FIGS. 4A to 4C, reference symbol $WL_n$ represents the word line of the memory cells not shown in the drawing corresponding to another plate voltage supply circuit. Reference symbols "H" and "L" respectively represent the source voltage level Vcc and ground voltage level Vss. It will be noted that "H" represents the raised voltage level compared to the source voltage $V_{cc}$ when the word lines $WL_1$–$WL_i$ are activated. For convenience's sake, it is assumed that the memory cell $MC_1$ connected with the word line $WL_1$ is selected, the polarized state of the first ferroelectric capacitor $C_{F1}$ connected with the first bit line BLn is at state point "A", (see FIG. 4B) and the polarized state of the second ferroelectric capacitor $C_{F2}$ connected with the second bit line BLnB is at state point "C" (see FIG. 4C).

At time t1, the signals PRE1, PRE2 and PRE3 supplied to the bit line precharge circuit 106 are respectively at "L", "H" and "H" levels, and the word lines $WL_1$–$WL_i$ are at "L" level. This maintains the polarized states of the capacitors of the memory cell $MC_1$ at the initial state points "A" and "C", respectively and the bit lines BLn and BLnB are set to ground voltage through the third and fourth transistors $M_3$ and $M_4$, which are turned on by the signal PRE2. Subsequently, at time t2, the precharge signals PRE1, PRE2 and PRE3 respectively go to "H", "L" and "H" levels, the word lines $WL_1$–$WL_i$ corresponding to the common plate line PL to "H" level, and the signal PRE_PL supplied to the plate voltage supply circuit 104 rises to "H" level. The first and second NMOS transistors $M_1$ and $M_2$ are turned on by the precharge signal PRE1 of "H" level, precharging the bit lines BLn and BLnB with $V_{cc}/2$.

At the same time, the plate line PL commonly connected with the memory cells $MC_1$–$MC_i$ is driven with $V_{cc}2$. In this case, the polarized states of the ferroelectric capacitors $C_{F1}$ and $C_{F2}$ of the memory cells $MC_1$–$MC_i$ are kept at the same state points "A" and "C" as at time t1 because the voltage of the common plate line PL is the same as the voltages of the bit lines BLn and BLnB. Consequently, the data stored in the memory cells connected with the word lines not selected is not affected without a recall or refresh operation.

Then, at time t3, the signals PRE1, PRE2 and PRE3 all go to "L" level, and the word lines $WL_1$–$WL_i$ go to "L" level. The precharge signal PRE3 of "L" level turns on the first and second PMOS transistors $M_5$ and $M_6$ to precharge the bit lines BLn and BLnB with $V_{cc}$. In this case, even though the bit lines BLn and BLnB are precharged with a voltage $V_{cc}$, and the signal PRE__PL applied to the plate voltage supply circuit 106 is kept at "H" level, the voltage of the common plate line PL is kept at the same level "H" as in the previous case.

Since the word lines $WL_1$–$WL_i$ corresponding to the memory cells commonly connected with the plate line PL are set to "L" level, the ferroelectric capacitors $C_{F1}$ and $C_{F2}$ of the memory cells connected with the word lines $WL_1$–$WL_i$ occupy the same state points "A" and "C" as at time t2. Namely, the polarized states of the first ferroelectric capacitors $C_{F1}$ connected through the first transistors $T_1$ with the first bit line BLn are at the state point "A" while the polarized states of the second ferroelectric capacitors $C_{F2}$ connected through the second transistors $T_2$ with the second bit line BLnB are at the state point "C".

As shown in FIG. 4A, the signals PRE1, PRE2 and PRE3 are kept at their respective "L", "L" and "H" at time t4, and the word lines $WL_1$–$WL_i$ continuously at level "L". The signals PRE1, PRE2 and PRE3 deactivate the bit line precharge circuit 106, turning off the NMOS and PMOS transistors $M_1$–$M_6$. In other words, the bit lines BLn and BLnB connected with the circuit 106 are floated. At time t5, the selected or addressed word line $WL_1$ goes to level "H", and the word lines $WL_i$ not selected and the signal PRE__PL are continuously kept at their respective levels "L" and "H", thereby turning on the switch transistors $T_1$ and $T_2$ of the memory cell $MC_1$ connected with the selected word line $WL_1$. Namely, a positive voltage is applied to both ends of the ferroelectric capacitors $C_{F1}$ and $C_{F2}$ respectively connected with the bit lines BLn and BLnB so that the polarization domain of the first ferroelectric capacitor $C_{F1}$ connected with the first bit line BLn is switched from the state point "A" to "B", and the polarization domain of the second ferroelectric capacitor $C_{F2}$ connected with the second bit line BLnB from the state point "C" to "B". Consequently, as shown in FIG. 4A, the voltages of the bit lines BLn and BLnB are lowered less than $V_{cc}$ according to switching and non-switching. In this case, it will be noted that the voltage of the bit line BLn corresponding to the first switched capacitor $C_{F1}$ is always lower than that of the bit line BLnB corresponding to the non-switched capacitor $C_{F2}$.

At time t6 the sensing operation is performed. Namely, as shown in FIG. 4A, as the signal goes to "H" level, the sense amplifier 108 amplifies the voltage of the first bit line BLn to the source voltage, towering the voltage of the second bit line BLnB to ground voltage. The voltages detected and amplified of the bit lines BLn and BLnB are respectively transferred through the column pass gate circuit 110 controlled by the signals Y and YB to corresponding input/output lines IO and IOB. At the same time, the switched capacitor (the first ferroelectric capacitor $C_{F1}$ connected with the first bit line BLn) is subjected to the refresh operation. Namely, the bit lines BLn and BLnB are respectively made to have ground voltage Vss and the source voltage $V_{cc}$ by the sense amplifier 108, the selected word line $WL_1$ is kept at "H" level, and the common plate line PL at the same voltage $V_{cc}/2$ as in the previous state, so that a negative voltage is applied to both ends of the first ferroelectric capacitor $C_{F1}$ corresponding to the first bit line BLn.

Subsequently, at time t6, the refresh operation is performed together with the detecting operation so as to move the polarization domain of the first capacitor $C_{F1}$ from the state point "C" to "D". Namely, the polarization domain reversed at time t5 is changed to the initially polarized state. On the contrary, a positive voltage is applied to both ends of the second ferroelectric capacitor $C_{F2}$ corresponding to the bit line BLnB, keeping the second capacitor $C_{F2}$ at the state point "C".

At time t7, as the precharge signals PRE1, PRE2 and PRE3 go respectively to levels "H", "L" and "H", the bit lines BLn and BLnB are precharged with $V_{cc}/2$ by means of the first and second NMOS transistors $M_1$ and $M_2$ controlled by the precharge signal PRE1. In this case, as shown in FIG. 4, all the word lines $WL_1$–$WL_i$ corresponding to the memory cells connected with the common plate line PL are activated to the level "H", so that both ends of the ferroelectric capacitors $C_{F1}$ and $C_{F2}$ of the memory cells $MC_1$–$MC_i$ are applied with the same voltage. In other words, the bit lines BLn and BLnB are applied with $V_{cc}/2$ by means of the precharge circuit consisting of the first and second NMOS transistors $M_1$ and $M_2$ while the common plate line PL is applied with $V_{cc}/2$ by means of the plate voltage supply circuit 104. This prevents the loss of the data stored in the memory cells corresponding to the word lines not selected. At time t7, the polarized states of the ferroelectric capacitors $C_{F1}$ and $C_{F2}$ are kept the same as in the previous state, as shown in FIG. 4B and 4C.

At time t8, in order to perform the read operation, the signals PRE1, PRE2 and PRE3 respectively go to the levels "L", "H" and "H", and the signal PRE__PL to the level "L", so that the bit lines BLn and BLnB are precharged to the ground voltage $V_{ss}$ by means of the third and fourth transistors $M_3$ and $M_4$ controlled by the signal PRE2. Subsequently, at time t9, the selected word line $WL_1$ is inactivated to the level "L", completing the read operation. In this case, the polarized states of the ferroelectric capacitors $C_{F1}$ and $C_{F2}$ are kept the same as in the previous state, as shown in FIGS. 4B and 4C. As described above, the read operation is achieved through a series of the precharging and detecting operations of the bit lines. Thus, a nonvolatile DRAM in accordance with the present invention does not require the recall or refresh operation, which is different from the conventional nonvolatile DRAM.

Figure 5A:
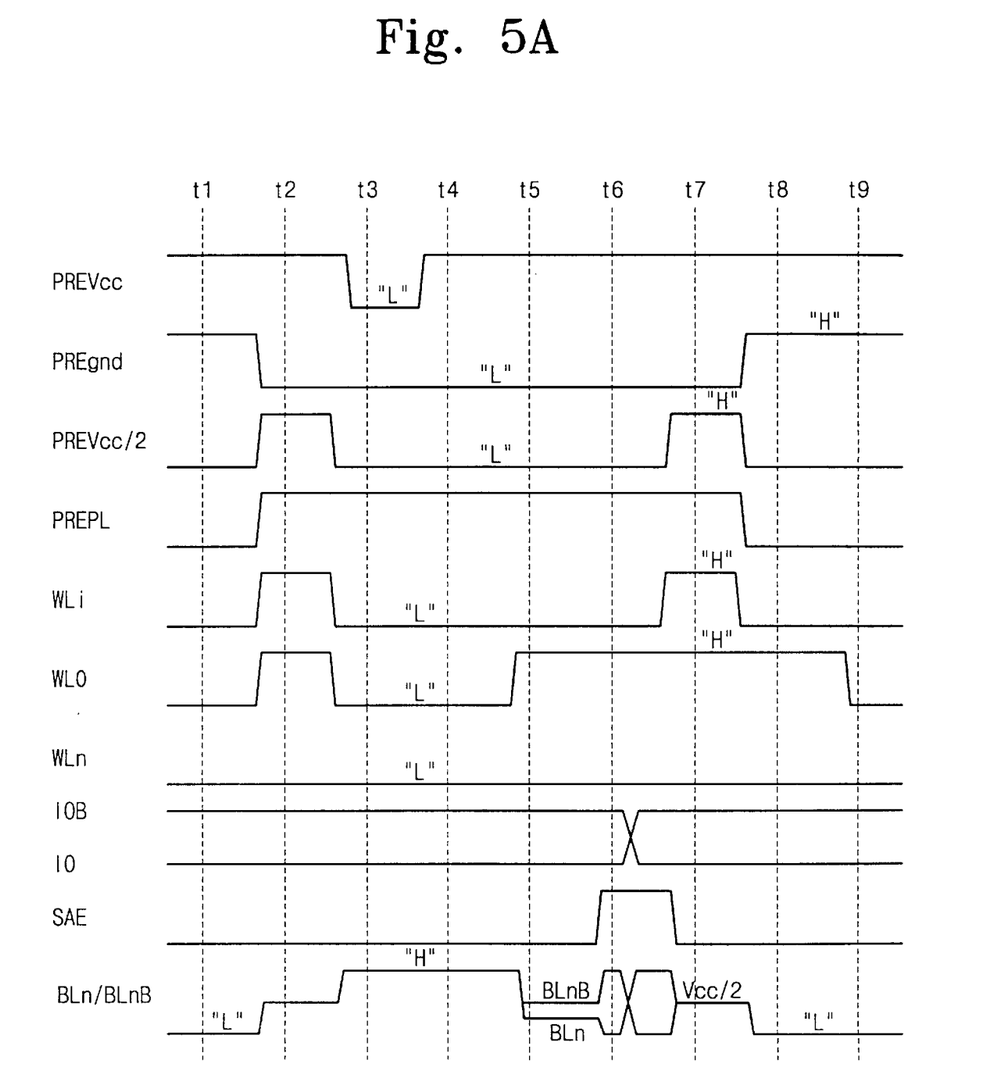
FIGS. 5A to 5C are timing diagrams illustrating the signals used in FIG. 3 according to a preferred embodiment of the inventive write operation.
Figure 5B:
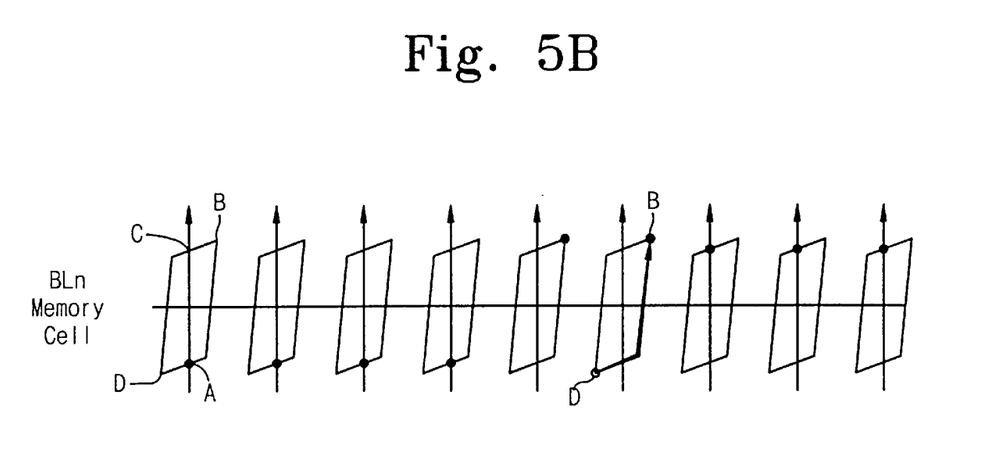
Figure 5C:
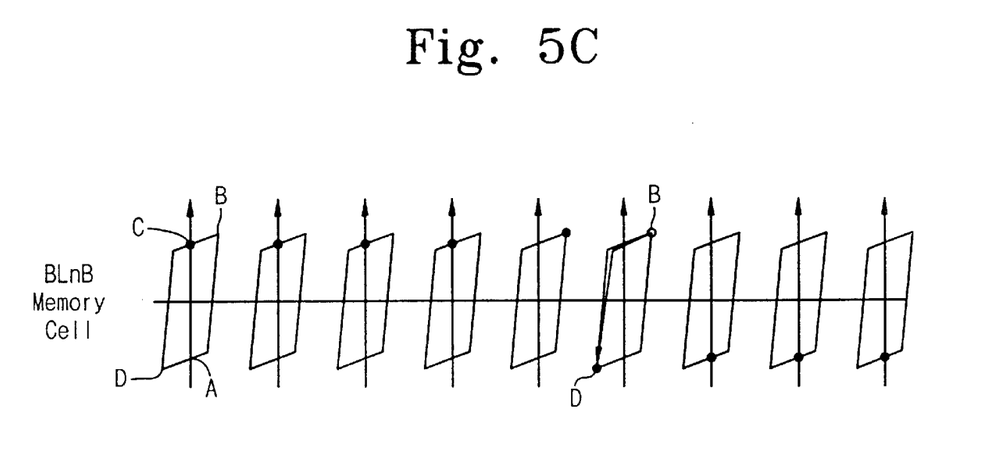

Describing the write operation in connection with FIGS. 5A to 5C, reference numeral $WL_i$ represents the word line corresponding to another plate voltage supply circuit 104 and the memory cells not shown in the drawing. Likewise, "H" represents the source voltage level $V_{cc}$, and "L" ground level $V_{ss}$. It will be noted that "H" is higher than $V_{cc}$ when the word lines $WL_1$–$WL_i$ are activated. For convenience's sake, it is assumed that the memory cell connected with the word line $WL_1$ is selected, the polarized state of the first ferroelectric capacitor $C_{F1}$ connected with the first bit line BLn occupies the state point "A", and the polarized state of the second ferroelectric capacitor $C_{F2}$ connected with the second bit line BLnB occupies the state point "C".

The operations connected with the times t1 to t5 are the same as those described in connection with FIGS. 4A to 4C, and therefore their description is omitted. At time t6, the signals PRE1, PRE2 and PRE3 go respectively to levels "H", "L" and "H" in the same manner as in FIG. 4A, the voltage of the plate line PL commonly connected with the memory cells becomes $V_{cc}/2$, and the signal SAE applied to the sense amplifier 108 goes to the level "H". Consequently, the detection operation is performed respectively charging the bit lines BLn and BLnB with ground voltage $V_{ss}$ and the source voltage $V_{cc}$, so that the first ferroelectric capacitor $C_{F1}$ corresponding to the first bit line BLn is instantly switched from the state point "B" to "D", and the second ferroelectric capacitor $C_F$ corresponding to the second bit line BLnB is kept at the state point "B".

Subsequently, the column pass gate circuit 110 is activated to transfer the external data on the input/output lines IO and IOB through the sense amplifier 108 to the respective bit lines BLn and BLnB to write them into the selected memory cells. Thus, it is assumed that the bit lines BLn and BLnB are respectively charged with the source voltage $V_{cc}$ and ground voltage $V_{ss}$. Then, both ends of the first ferroelectric capacitor $C_{F1}$ corresponding to the first bit line BLn are applied with a positive voltage, and both ends of the second ferroelectric capacitor $C_{F2}$ corresponding to the second bit line BLnB with a negative voltage. This switches the first ferroelectric capacitor $C_{F1}$ connected with the bit line BLn from the state point "D" through the state point "A" to the state point "B", and the second ferroelectric capacitor $C_{F2}$ connected with the second bit line BLnB from the state point "A" through the state point "B" to the state point "D".

Consequently, the external data are written into the memory cells connected with the selected word line WL. The subsequent operations connected with the times t7 to t9 are the same as those described in connection with FIGS. 4A to 4C.

Thus, at times t2 and t7, the data stored in the memory cells of the unelected word lines connected with the common plate line PL are prevented from being lost by supplying both ends of the ferroelectric capacitors of the memory cells with the same voltage, e.g., half-$V_{cc}$ ($V_{cc}/2$). Namely, when precharging the bit lines with $V_{cc}/2$ before and after the write/read operation with the common plate line PL applied with $V_{cc}/2$, all the word lines are activated so as to supply both ends of the ferroelectric capacitors with the same voltage. This enables the write/read operation to be performed without the conventional recall or refresh operation.

While the present invention has been described in connection with specific embodiments accompanied by the attached drawings, it will be readily appreciated by those skilled in the art that various changes and modifications may be made thereto without departing the gist of the present invention.

What is claimed is:

1. A nonvolatile dynamic random access memory, comprising:

a plurality of word lines;

a plate line;

a bit line pair, including first and second bit lines, arranged to intersect the word lines;

a plurality of memory cells connected to a corresponding word line between the pair of bit lines, each memory cell comprising first and second access transistors and first and second ferroelectric capacitors, the first ferroelectric capacitor and the first access transistor being connected in series between the first bit line and the plate line, the second ferroelectric capacitor and the second access transistor being connected in series between the second bit line and the plate line, and gates of the first and second access transistors being commonly connected with the corresponding word line;

a precharge circuit for sequentially precharging the bit line pair with one of a first, second, and third voltage in response to first, second, and third precharge signals; and a voltage supply circuit for supplying the plate line with one of the first and second voltages.

2. A nonvolatile dynamic random access memory, as recited in claim 1, wherein the first voltage is a source voltage, the second voltage is half of the source voltage, and the third voltage the ground voltage.

3. A nonvolatile dynamic random access memory, as recited in claim 1, wherein the precharge circuit sequentially precharges the bit line pair with one of the first, second, and third voltage before a data write/read operation, and then sequentially precharges the bit line pair with one of the first, second, and third voltages after the data write/read operation.

4. A nonvolatile dynamic random access memory, as recited in claim 3, wherein the plurality of word lines are activated while the pair of bit lines are precharged with the second voltage by means of the precharge circuit before and after the data write/read operation.

5. A nonvolatile dynamic random access memory, as recited in claim 1, wherein the precharge circuit further comprises:

first and second transistors having current paths connected in series between the first and second bit lines and gates supplied with the first precharge signal, the junction of the current paths being supplied with the second voltage;

third and fourth transistors having current paths connected in series between the first and second bit lines and gates supplied with the second precharge signal, the junction of the current paths being supplied with the third voltage; and fifth and sixth transistors having current paths connected in series between the first and second bit lines and gates supplied with the third precharge signal, the junction of the current paths being supplied with the first voltage.

6. A nonvolatile dynamic random access memory, as recited in claim 1, further comprising a sense amplifier, connected to the bit line pair, for detecting and amplifying the voltage difference between the bit line pair in response to a sense control signal.

7. A nonvolatile dynamic random access memory, as recited in claim 6, further comprising a column pass gate, connected to the sense amplifier, for transferring the amplified voltage difference to an input/output line in response to a column pass control signal.

* * * * *